(12) United States Patent
Kitoku et al.

(10) Patent No.: US 6,990,747 B2
(45) Date of Patent: Jan. 31, 2006

(54) VACUUM PROCESSING APPARATUS AND SUBSTRATE TRANSFER METHOD

(75) Inventors: Toshihiko Kitoku, Nirasaki (JP); Shinji Niwa, Nirasaki (JP); Toshiki Hosaka, Kofu (JP); Takashi Kitazawa, Nirasaki (JP); Atsuo Sanda, Oita (JP); Yoshitaka Sato, Yokohama (JP)

(73) Assignees: Tokyo Electron Limited, Tokyo (JP); Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/821,971

(22) Filed: Apr. 12, 2004

(65) Prior Publication Data

US 2004/0255485 A1    Dec. 23, 2004

(30) Foreign Application Priority Data

Apr. 16, 2003  (JP)  .............. P2003-111686

(51) Int. Cl.
*F26B 13/30*  (2006.01)
(52) U.S. Cl. .............. 34/92; 34/526; 34/527; 34/538; 34/540; 34/559; 34/570
(58) Field of Classification Search .............. 34/92, 34/526, 527, 538, 540, 558, 559, 570
See application file for complete search history.

(56) References Cited

U.S. PATENT DOCUMENTS 6,274,507 B1  8/2001  Narita et al.
6,473,995 B2 *  11/2002  Miyakawa et al. .......... 34/92

FOREIGN PATENT DOCUMENTS

JP    11-204508    7/1999

* cited by examiner

*Primary Examiner*—Jiping Lu
(74) *Attorney, Agent, or Firm*—Oblon, Spivak, McClelland, Maier & Neustadt, P.C.

(57) ABSTRACT

An etching processing apparatus 1 has a transfer chamber 2, a plurality of processing chambers 3 and 4, and a plurality of cassette chambers 7 and 8. Inside the transfer chamber 2, a transfer mechanism 14 is provided. A control device 17 pauses the operation of the vacuum pump 16 after closing an opening/closing valve 15 of a vacuum evacuating mechanism, which vacuum evacuates the transfer chamber 2 in which the transfer mechanism 14 is provided, when the operation of the transfer mechanism 14 is paused for a predetermined time or longer. Accordingly, conservation of energy becomes possible without causing decrease of productivity.

8 Claims, 3 Drawing Sheets

VACUUM PROCESSING APPARATUS AND SUBSTRATE TRANSFER METHOD

CROSS REFERENCE TO RELATED APPLICATIONS

This application is based upon and claims the benefit of priority from the prior Japanese Patent Application No. 2003-111686, filed on Apr. 16, 2003; the entire contents of which are incorporated herein by reference.

BACKGROUND OF THE INVENTION

1. Field of the Invention

The present invention relates to a vacuum processing apparatus and substrate transfer method, and more particularly to a vacuum processing apparatus configured to perform vacuum processing such as etching, film forming, or the like on a processing substrate such as a semiconductor wafer, a glass substrate for a liquid crystal display device, or the like.

2. Description of the Related Art

Conventionally, in a fabrication process of a semiconductor device, a vacuum processing apparatus configured to perform vacuum processing such as etching, film forming, or the like on a processing substrate such as a semiconductor wafer, a glass substrate for a liquid crystal display device, or the like under a vacuum atmosphere is widely used.

As an example of such a vacuum processing apparatus, there is a plasma processing apparatus which applies a plasma on a processing substrate to perform processing such as etching, film forming, or the like. The plasma processing apparatus accommodates a processing substrate in a processing chamber and makes a predetermined vacuum atmosphere inside the processing chamber to generate a plasma. For this purpose, the processing chamber is provided with a vacuum pump such as a dry pump, a turbo pump, and the like which vacuum evacuates the inside of the processing chamber.

Further, for purposes of improving a throughput, achieving unmanned operation by automatic transfer, and the like, in many of the above-described plasma processing apparatuses, carrying and transferring of a processing substrate into/from the above described processing chamber are automatically performed by a transfer mechanism. Furthermore, for purposes of performing such automatic transfer and plasma processing efficiently as well as decreasing a so-called footprint so as to effectively utilize spaces, there is also a type of the plasma processing apparatus which has a plurality of processing chambers and cassette chambers provided in the vicinity of a transfer chamber accommodating a transfer mechanism and is configured to transfer processing substrates from the inside of the cassette chambers to the processing chambers by the transfer mechanism provided inside the transfer chamber, and to transfer the processed substrates from the processing chambers to cassettes inside the cassette chambers.

In such a case, a vacuum pump is provided in each of the processing chambers, the transfer chamber, and the cassette chambers in order to keep a predetermined vacuum state inside these chambers (refer to Japanese Patent Application Laid-open No. Hei 11-204508 for example).

As described above, a conventional vacuum processing apparatus such as the plasma processing apparatus or the like is intended for enhancement of processing efficiency, effective utilization of spaces, and the like by appropriately combining the processing chamber, the transfer chamber, the cassette chamber, and the like.

However, in recent years, it has become indispensable to conserve energy in respective industries. For this purpose, the vacuum processing apparatus is required to conserve more energy as compared to conventional ones to thereby decrease power consumption or the like. On the other hand, it is necessary to avoid decrease of productivity caused by, for example, decrease of yield or the like. Therefore, energy conservation without causing the decrease of productivity is desired.

SUMMARY OF THE INVENTION

The present invention is made in view of such conventional situations, and an object thereof is to provide a vacuum processing apparatus and substrate transfer method capable of conserving energy without causing decrease of productivity.

In order to solve such problems, a vacuum processing apparatus according to a first aspect of the present invention includes: a processing chamber, which accommodates a processing substrate, in which processing is performed on the processing substrate under a vacuum atmosphere; a transfer chamber connected to the processing chamber with an opening/closing mechanism interposed therebetween; a transfer mechanism which is provided inside the transfer chamber and which transfers the processing substrate; a vacuum pump which evacuates the inside of the transfer chamber to a vacuum atmosphere; an opening/closing valve interposed between the transfer chamber and the vacuum pump; and a control device which closes the opening/closing valve and pauses operation of the vacuum pump when operation of the transfer mechanism is paused for a predetermined time or longer.

In one aspect of the above-described vacuum processing apparatus, the predetermined time is a time in which an amount of power to be reduced during a pause time of the vacuum pump is larger than an amount of extra power needed when restarting the vacuum pump.

In one aspect of the above-described vacuum processing apparatus, operation of the vacuum pump is paused after the control device closes the opening/closing valve and a predetermined time passes.

One aspect of the above-described vacuum processing apparatus further includes a cassette chamber which accommodates a cassette capable of accommodating a plurality of the processing substrates and which is connected to the transfer chamber with an opening/closing mechanism interposed therebetween.

One aspect of the above-described vacuum processing apparatus further includes an alignment mechanism which performs alignment of the processing substrate, and the transfer mechanism transfers the processing substrate from the cassette chamber to the alignment mechanism, and transfers the processing substrate to the processing chamber after the alignment is performed.

In one aspect of the above-described vacuum processing apparatus, the processing chamber is configured to generate a plasma by applying high-frequency power thereto, and the control device closes the opening/closing valve and pauses operation of the vacuum pump when the high-frequency power is applied and the transfer mechanism is paused for a predetermined time or longer.

In one aspect of the above-described vacuum processing apparatus, a plurality of the processing chambers are provided.

In one aspect of the above-described vacuum processing apparatus, the processing chamber is an etching processing chamber which performs etching on the processing substrate.

According to a second aspect of the present invention, provided is a substrate transfer method of transferring a substrate by a transfer mechanism inside a transfer chamber configured to have a vacuum atmosphere by a vacuum pump connected thereto with an opening/closing valve interposed therebetween, the substrate transfer method closes the opening/closing valve and pauses operation of the vacuum pump when operation of the transfer mechanism is paused for a predetermined time or longer.

In one aspect of the above-described substrate transfer method, the predetermined time is a time in which an amount of power to be reduced during a pause time of the vacuum pump is larger than an amount of extra power needed when restarting the vacuum pump.

In one aspect of the above-described substrate transfer method, the operation of the vacuum pump is paused after the opening/closing valve is closed and a predetermined time passes.

In one aspect of the above-described substrate transfer method, a processing chamber is connected to the transfer chamber with an opening/closing mechanism interposed therebetween, the processing chamber being configured to generate a plasma by applying high-frequency power thereto; and the opening/closing valve is closed and the operation of the vacuum pump is paused when the high-frequency power is applied and the operation of the transfer mechanism is paused for a predetermined time or longer.

In one aspect of the above-described substrate transfer method, the processing chamber is an etching processing chamber which performs etching on a substrate.

DESCRIPTION OF THE EMBODIMENT

Hereinafter, a vacuum processing apparatus and a substrate transfer method according to an embodiment of the present invention will be described in detail with reference to the drawings.

Figure 1:
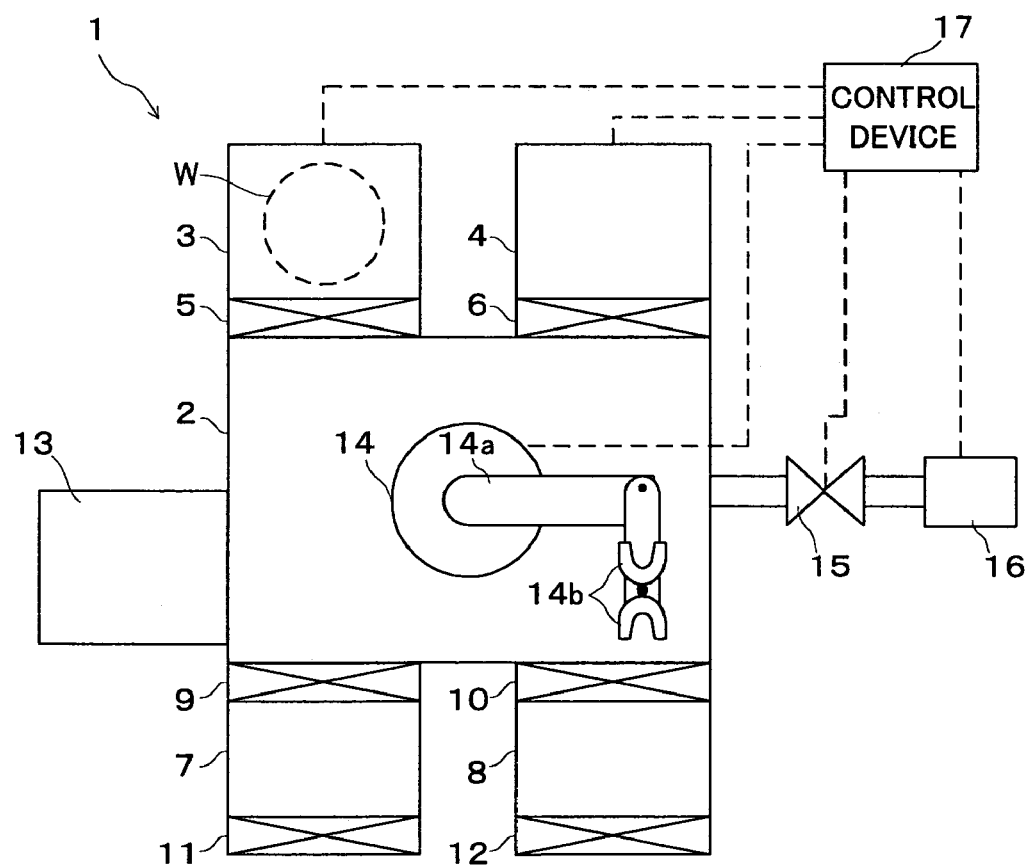
FIG. 1 is a view schematically showing a configuration of an etching processing apparatus according to an embodiment of the present invention.

FIG. 1 schematically shows a configuration of an etching processing apparatus, which is the vacuum processing apparatus according to the embodiment of the present invention.

This etching processing apparatus 1 has a transfer chamber 2 configured to be capable of airtightly closing the inside thereof. To this transfer chamber 2, two processing chambers 3 and 4 configured to be capable of airtightly closing the inside thereof are connected with opening/closing mechanisms 5 and 6 interposed therebetween respectively.

Each of these processing chambers 3 and 4 is provided with a well-known plasma etching processing mechanism, which is constituted by a lower electrode on which a wafer W is mounted, an upper electrode arranged so as to oppose the lower electrode, a power supply for supplying high-frequency power between the lower electrode and the upper electrode, a vacuum pump for evacuating the inside of the processing chamber 3 or 4 to a predetermined vacuum level, a processing gas supply mechanism for supplying a predetermined processing gas (etching gas) into the processing chamber 3 or 4 (all not shown), or the like. A plasma is applied to the wafer W mounted on the lower electrode to thereby perform predetermined etching processing on the wafer W.

Further, two cassette chambers 7 and 8 configured to be capable of airtightly closing the inside thereof are connected to the transfer chamber 2 with opening/closing mechanisms 9 and 10 interposed therebetween respectively. Each of these cassette chambers 7 and 8 is configured to be capable of accommodating a wafer cassette which accommodates a plurality of wafers W (25 wafers for example). Between the cassette chambers 7 and 8 and the outside, opening portions for carrying in the wafer cassettes from the outside and for carrying them out are provided, and on these opening portions, opening/closing mechanisms 11 and 12 configured to be capable of airtightly closing the opening portions are provided. Further, also in these cassette chambers 7 and 8, evacuating mechanisms constituted by not-shown vacuum pumps or the like are provided to enable evacuation of the inside of the cassette chambers 7 and 8 to a predetermined vacuum level.

These cassette chambers 7 and 8 constitute a so-called load lock mechanism, and during normal operation, only these cassette chambers 7 and 8 will be opened to the atmosphere to carry in and carry out the wafer cassettes.

Further, on a side of the transfer chamber 2, a wafer alignment mechanism accommodating portion 13 is provided, and by a not-shown alignment mechanism provided in the wafer alignment mechanism accommodating portion 13, alignment of the wafer W, namely, alignment of an orientation flat thereof can be performed.

On the other hand, a transfer mechanism 14 is provided inside the transfer chamber 2. This transfer chamber 14 has an articulated arm 14a and two picks 14b, which are provided on the tip of the arm 14a and configured to be capable of rotating 180 degrees on the arm 14a, and is capable of retaining two wafers W in total at the same time by retaining the wafer W on each of the picks 14b.

Furthermore, a vacuum pump 16 is connected to the transfer chamber 2 with an opening/closing valve 15 interposed therebetween. This vacuum pump 16 is constituted by a dry pump or the like and is configured to be capable of evacuating the inside of the transfer chamber 2 to a predetermined vacuum level.

The opening/closing valve 15 and vacuum pump 16 are configured such that the operation thereof is controlled by a control device 17 which centrally controls the etching processing apparatus 1.

In the etching processing apparatus 1 configured as above, based on a sequence of processing inputted in advance, operation of the transfer mechanism 14 and so on is controlled by the control device 17, the wafers W are taken out one by one from inside the cassette chambers 7 and 8, alignment of orientation flats on the wafers W is performed in the wafer alignment mechanism accommodating portion 13, and thereafter the wafers W are carried into the processing chambers 3 and 4 to be subjected to predetermined etching processing. Then, by the transfer mechanism 14, the wafers W on which the etching processing is completed are taken out from the processing chambers 3 and 4 and accommodated in predetermined positions in the wafer cassettes inside the cassette chambers 7 and 8.

Incidentally, regarding the processing chambers 3 and 4, there are a case that the processing is performed using only one of the processing chambers 3 and 4, a case that the same processing is performed in parallel in each of the processing chambers 3 and 4, a case that different processing is performed in sequence in the processing chambers 3 and 4, and the like for example, depending on a sequence of processing to be performed.

Further, regarding the cassette chambers 7 and 8, there are a case that a wafer cassette for accommodating unprocessed wafers W is accommodated in one of them and a wafer cassette for accommodating processed wafers W is accommodated in the other of them, a case that the wafer cassette for accommodating the unprocessed wafers W is accommodated in each of them, and an unprocessed wafer W is taken out from inside the wafer cassette to be processed and then the processed wafer W is accommodated back in its original position in the wafer cassette, and the like.

In the etching processing apparatus 1 according to this embodiment, the control device 17 is configured to close the opening/closing valve 15 and pause operation of the vacuum pump 16 when operation of the transfer mechanism 14 is paused for a predetermined time or longer.

Specifically, the purpose of stopping the operation of the vacuum pump 16 is to reduce its power consumption in order to conserve energy, but since the transfer mechanism 14 moves to transfer the wafer W in the transfer chamber 2, when the operation of the vacuum pump 16 is paused in the middle of such transferring operation, there increases a possibility that the dust inside the transfer chamber 2 is raised to adhere to the wafer W accompanying the movement of the transfer mechanism 14. Accordingly, in the etching processing apparatus 1 according to this embodiment, the opening/closing valve 15 is closed and paused the operation of the vacuum pump 16 only during a period in which the operation of the transfer mechanism 14 is paused.

Figure 2:
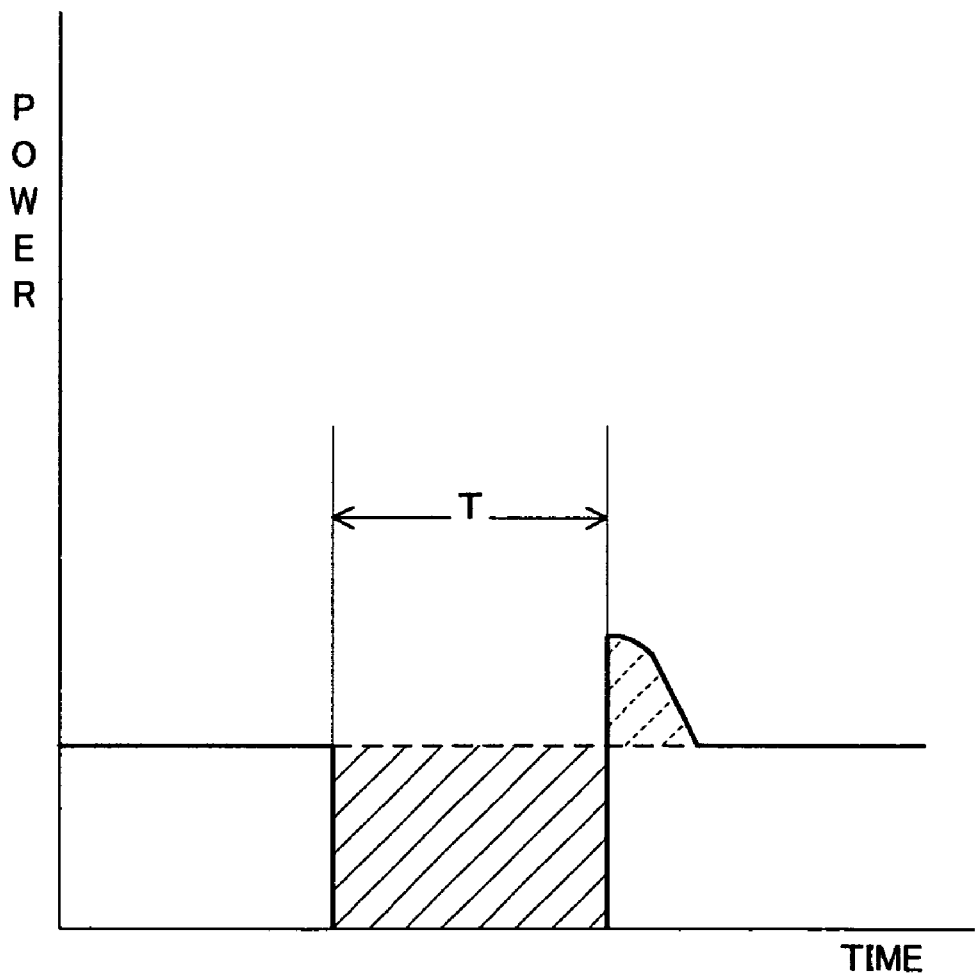
FIG. 2 is a view describing power consumption of a vacuum pump of the apparatus of FIG. 1.

Further, as shown in a graph of FIG. 2 where the vertical axis is power consumption of the vacuum pump (dry pump) 16 and the horizontal axis is a time, when the operation of the vacuum pump (dry pump) 16 is paused once and restarted, it requires larger power when restarting as compared to that during normal operation, and thus the power consumption increases temporarily. Consequently, when the operation of the vacuum pump 16 is paused for a short period and restarted thereafter, an amount of the power consumption may increase adversely.

Accordingly, in the etching processing apparatus 1 according to this embodiment, the operation of the vacuum pump 16 is paused only when an amount of power consumption (shown by solid slant lines in the figure) that can be reduced during a pause period T of the vacuum pump 16 shown in FIG. 2 is larger than an amount of extra power (shown by dashed slant lines in the figure) which is needed when restarting, so that the amount of power consumption can be reduced by temporarily pausing the operation of the vacuum pump 16.

Incidentally, when the operation of the vacuum pump 16 is actually paused, the opening/closing valve 15 should be closed in advance of pause of the operation of the vacuum pump 16. When the opening/closing valve 15 is closed, an operation time (a time needed for transiting from an open state to a close state) of the opening/closing valve 15 should be taken into account, and the operation of the vacuum pump 16 should be paused after a control signal of closing operation is sent to the opening/closing valve 15 and a time for the opening/closing valve 15 to completely close passes. Furthermore, when the temporarily paused vacuum pump 16 is restarted, the opening/closing valve 15 should be opened after the vacuum pump 16 is restarted and turns to a regular state, and also in this case, an operation time (a time needed for transiting from a close state to an open state) of the opening/closing valve 15 should be taken into account.

Furthermore, as described above, in order to prevent the dust inside the transfer chamber 2 from being raised accompanying the movement of the transfer mechanism 14, it is preferable to perform closing operation of the opening/closing valve 15 and subsequent pausing operation of the vacuum pump 16 after the operation of the transfer mechanism 14 is paused and a certain length of time delay is passed. Moreover, in reverse to the above operation, when the vacuum pump 16 is restarted, restarting or the like of the vacuum pump 16 should be performed in advance of start of the operation of the transfer mechanism 14.

According to the reasons described above, a possible pause period of the vacuum pump 16 becomes shorter than an actual pause period of the transfer mechanism 14, so that whether or not to actually pause the vacuum pump 16 is determined according to whether or not the amount of power consumption can be reduced in such a shorter possible pause period.

Figure 3:
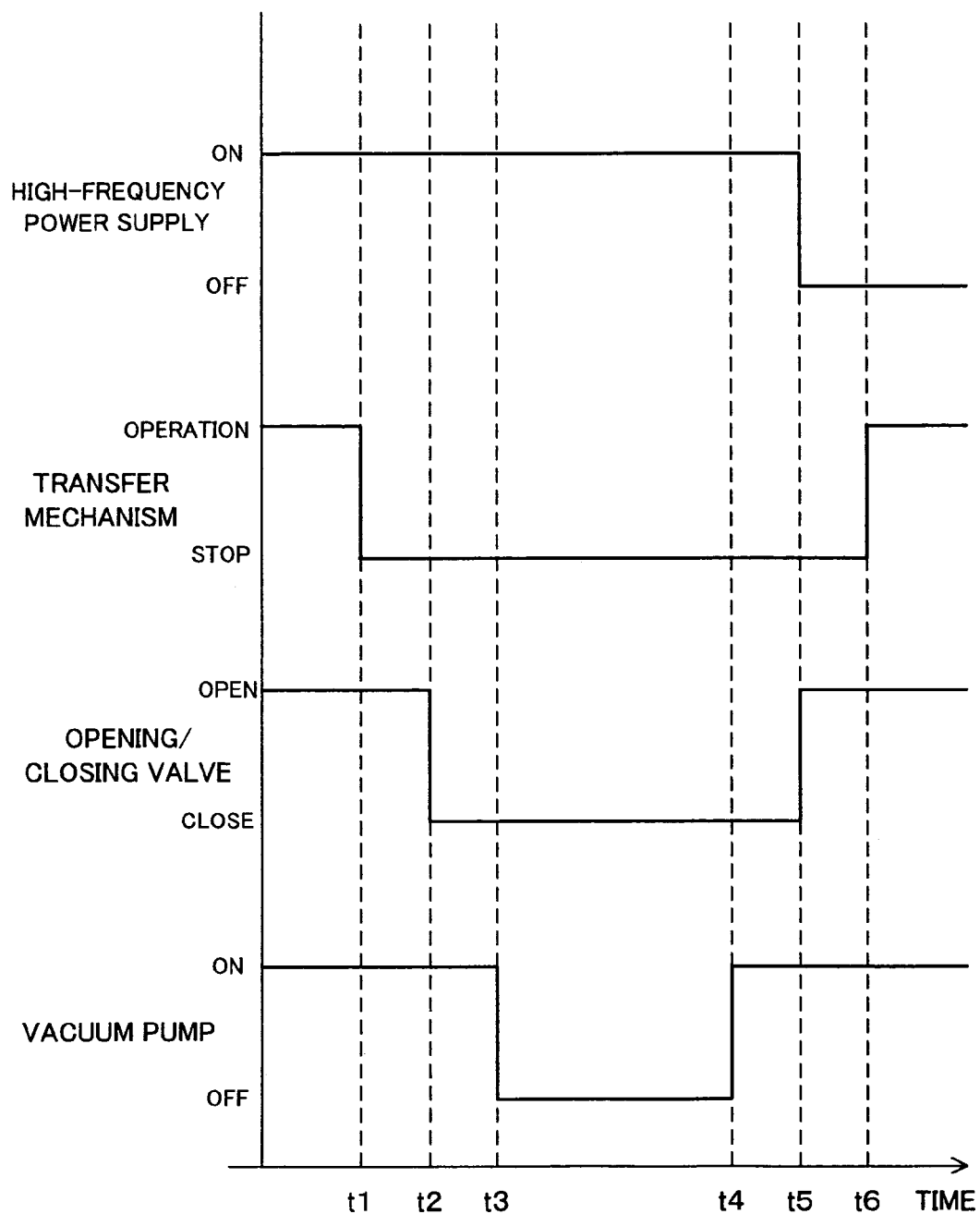
FIG. 3 is a view describing timing of operation control of the apparatus of FIG. 1.

FIG. 3 is a timing chart showing an aspect of operation control of the transfer mechanism 14, the opening/closing valve 15, and the vacuum pump 16 by the above-described control device 17. FIG. 3 shows from the top in order a state of an operation control signal of the high-frequency power supply of the processing chambers 3 and 4, a state of an operation control signal of the transfer mechanism 14, a state of an operation control signal of the opening/closing valve 15, and a state of an operation control signal of the vacuum pump 16.

Here, in a case that a plurality of the wafers W are processed in sequence, timing to pause the operation of the transfer mechanism 14 during such a regular operation state is when processing on the wafers W is performed in the processing chambers 3 and 4 (or in one of the processing chambers 3 and 4 depending on the sequence as described above), and the transfer mechanism 14 is retaining the wafers W to be processed next and standing by in front of the opening/closing mechanisms 5 and 6 of the processing chambers 3 and 4 until the processing inside the processing chambers 3 and 4 is completed.

Accordingly, at this moment, the high-frequency power supply is on in principle so that a plasma is in a generated state.

Subsequently, first, when the operation of the transfer mechanism 14 is paused at the time t1, the opening/closing valve 15 is closed at the time t2 after a predetermined time delay (a few seconds, approximately) is passed.

Next, after the above-described predetermined time delay (a few seconds, approximately) in which the operation time or the like of the opening/closing valve 15 is taken into account is passed, the operation of the vacuum pump 16 is paused at the time t3.

On the other hand, when the transfer mechanism 14 which paused operation as described above restarts operation at the time t6, the vacuum pump 16 is restarted first at the time t4 in advance thereof, and thereafter the opening/closing valve 15 is opened at the time t5 after a predetermined time delay is passed. At this time, the restart of the vacuum pump 16 and the opening operation of the opening/closing valve 15 are performed in advance so as to assure a predetermined time delay thereafter between the time t5 and the time t6.

Incidentally, regarding the restart of the operation of the transfer mechanism 14 at the time t6 after the operation thereof is paused at the time t1, the control device 17 detects the restart based on a sequence of processing inputted in advance and controls the above-described restart of the vacuum pump 16 and opening operation of the opening/closing valve 15 in advance so as to assure a predetermined time delay before the time t6.

Further, whether to pause the vacuum pump 16 or not is actually determined according to whether or not an amount of power consumption that can be reduced during the possible pause period (t4–t3) of the vacuum pump 16, in which the predetermined time delay is taken into account with respect to the above-described pause period (t6–t1) of the transfer mechanism 14, is larger than an amount of extra power which is needed while restarting, so that the power consumption can be reduced.

Incidentally, the above-described amount of the extra power needed when restarting is substantially constant depending on a type of the vacuum pump 16. Further, the respective time delays described above are static depending on a type of the opening/closing valve 15, the structure of the apparatus, or the like.

Accordingly, in the control device 17, a predetermined period Ta, which is obtained in advance by adding up the above-described time delays, is compared with the pause period (t6–t1) of the transfer mechanism 14, and the control to pause the operation of the vacuum pump 16 is performed only when the pause period of the transfer mechanism 14 becomes the predetermined period or longer (when Ta≦(t6–t1)).

As described above, in the etching processing apparatus 1 according to this embodiment, the control device 17 is configured to pause the operation of the vacuum pump 16 after closing the opening/closing valve 15 of the vacuum evacuating mechanism, which vacuum evacuates the transfer chamber 2 in which the transfer mechanism 14 is provided, when the operation of the transfer mechanism 14 is paused for the predetermined time or longer.

Therefore, as compared to a case that the vacuum pump 16 is sequentially operated, the power consumption can be largely reduced. Further, by pausing the vacuum pump 16, dust inside the transfer chamber 2 can be prevented from being raised to adhere to the wafers W. Therefore, conservation of energy becomes possible without causing decrease of productivity.

It should be noted that the above-described example describes a case that the present invention is applied to the plasma etching, but the present invention is not limited to this case. As a matter of course, the present invention can be applied to any other vacuum processing such as film forming or the like. Further, the processing substrate is not limited to the wafer W, and as a matter of course, the present invention can be applied to any other substrate such as a glass substrate for an LCD, and the like. Furthermore, the above-described example describes a case that only one dry pump or the like is used as the vacuum pump 16, but as a matter of course, the present invention can be similarly applied with a configuration such that a turbo pump and a dry pump are connected in series for achieving a higher vacuum. Incidentally, in such a configuration, an opening/closing valve is also interposed between the turbo pump and the dry pump, and only the dry pump is configured to be paused by closing the opening/closing valve, where the turbo pump is configured not to be paused.

As has been described above, the vacuum processing apparatus according to the present invention can realize conservation of energy without causing decrease of productivity.

What is claimed is:

1. A vacuum processing apparatus, comprising:
   a processing chamber, which accommodates a processing substrate, in which processing is performed on the processing substrate under a vacuum atmosphere;
   a transfer chamber connected to said processing chamber with an opening/closing mechanism interposed therebetween;
   a transfer mechanism which is provided inside said transfer chamber and which transfers the processing substrate;
   a vacuum pump which evacuates the inside of the transfer chamber to a vacuum atmosphere;
   an opening/closing valve interposed between said transfer chamber and said vacuum pump; and
   a control device which closes said opening/closing valve and pauses operation of said vacuum pump when operation of said transfer mechanism is paused for a predetermined time or longer.

2. The vacuum processing apparatus as set forth in claim 1,
   wherein the predetermined time is a time in which an amount of power to be reduced during a pause time of said vacuum pump is larger than an amount of extra power needed when restarting said vacuum pump.

3. The vacuum processing apparatus as set forth in claim 1,
   wherein operation of said vacuum pump is paused after said control device closes said opening/closing valve and a predetermined time passes.

4. The vacuum processing apparatus as set forth in claim 1, further comprising:
   a cassette chamber which accommodates a cassette capable of accommodating a plurality of the processing substrates and which is connected to said transfer chamber with an opening/closing mechanism interposed therebetween.

5. The vacuum processing apparatus as set forth in claim 4, further comprising:
   an alignment mechanism which performs alignment of the processing substrate,
   wherein said transfer mechanism transfers the processing substrate from said cassette chamber to said alignment mechanism, and transfers the processing substrate to said processing chamber after the alignment is performed.

6. The vacuum processing apparatus as set forth in claim 1,
   wherein said processing chamber is configured to generate a plasma by applying high-frequency power thereto; and
   wherein said control device closes said opening/closing valve and pauses operation of said vacuum pump when the high-frequency power is applied and said transfer mechanism is paused for a predetermined time or longer.

7. The vacuum processing apparatus as set forth in claim 1,
   wherein a plurality of said processing chambers are provided.

8. The vacuum processing apparatus as set forth in claim 1,
   wherein said processing chamber is an etching processing chamber which performs etching on the processing substrate.

* * * * *